(12) United States Patent
Yuu et al.

(10) Patent No.: US 6,891,316 B2
(45) Date of Patent: May 10, 2005

(54) LAMINATED PIEZOELECTRIC ELEMENT, ACTUATOR AND PRINTING HEAD

(75) Inventors: Yoshihiro Yuu, Kokubu (JP); Shuzo Iwashita, Kokubu (JP); Daisuke Takahashi, Kokubu (JP)

(73) Assignee: Kyocera Corporation, Kyoto (JP)

( * ) Notice: Subject to any disclaimer, the term of this patent is extended or adjusted under 35 U.S.C. 154(b) by 23 days.

(21) Appl. No.: 10/648,040

(22) Filed: Aug. 26, 2003

(65) Prior Publication Data
US 2004/0104644 A1 Jun. 3, 2004

(30) Foreign Application Priority Data

Aug. 27, 2002 (JP) ........................................ 2002-247321
Mar. 27, 2003 (JP) ........................................ 2003-087261

(51) Int. Cl.⁷ .............................................. H01L 41/08
(52) U.S. Cl. ........................................ 310/363; 310/364
(58) Field of Search ................................ 310/324, 328, 310/330–332, 363, 364

(56) References Cited

U.S. PATENT DOCUMENTS

| | | | |
|---|---|---|---|
| 5,402,159 A | 3/1995 | Takahashi et al. | |
| 5,721,464 A | 2/1998 | Dibbern et al. | |
| 6,172,447 B1 | 1/2001 | Ishikawa et al. | |
| 6,530,652 B1 * | 3/2003 | Kim et al. | 347/70 |
| 6,584,660 B1 * | 7/2003 | Shimogawa et al. | 29/25.35 |
| 6,703,257 B2 * | 3/2004 | Takeuchi et al. | 438/50 |
| 6,752,601 B2 * | 6/2004 | Takeuchi et al. | 417/322 |
| 6,796,011 B2 * | 9/2004 | Takeuchi et al. | 29/25.35 |

FOREIGN PATENT DOCUMENTS

| | | |
|---|---|---|
| JP | 11-121820 | 4/1999 |

* cited by examiner

*Primary Examiner*—Mark Budd
(74) *Attorney, Agent, or Firm*—Hogan & Hartson, LLP

(57) ABSTRACT

The laminated piezoelectric element having a thickness of 100 μm or less of the present invention comprises a laminate which comprises a plurality of piezoelectric ceramic layers 1, and electrodes 2,3 provided the surface and the inside of the laminate, wherein the electrode 2 comprises a silver-palladium alloy containing 71 to 99.9% by volume of silver and 0.1 to 29% by volume of palladium.

20 Claims, 3 Drawing Sheets

(a)

(b)

LAMINATED PIEZOELECTRIC ELEMENT, ACTUATOR AND PRINTING HEAD

BACKGROUND OF THE INVENTION

1. Field of the Invention

The present invention relates to a laminated piezoelectric element, an actuator and a printing head and, more particularly, to a laminated piezoelectric element and an actuator that are suitable for the piezoelectric sensor of, for example, a fuel injector, an ink jet printer, a piezoelectric resonator, an oscillator, an ultrasonic motor, an ultrasonic oscillator, a filter, an acceleration sensor, a knocking sensor, an AE sensor or the like, and can be advantageously used particularly for a printing head that utilizes vibration of a 2-dimensional vibration of expansion and contraction or linear vibration in the longitudinal direction or in the direction of the thickness.

2. Description of Related Art

Piezoelectric ceramics materials have been used in, for example, an actuator, a filter, a piezoelectric resonator (oscillator included), an ultrasonic oscillator, an ultrasonic motor and a piezoelectric sensor.

Among these devices, the piezoelectric actuator is used as the positioning actuator for an X-Y stage of semiconductor manufacturing equipment, the actuator for the printing head of an ink jet printer or the like, by making advantage of the very high response of the piezoelectric element to electrical signals, in the order of micro seconds. Especially with the recent trend of color printers toward higher printing speed and lower prices, piezoelectric elements are under increasing demand for the application to the ink discharging actuator of the ink jet printer or the like.

An actuator that uses a silver-palladium alloy for internal electrode is conventionally known. This actuator is manufactured in the following process. First, an electrically conductive paste is printed on the surface of a green sheet made of a piezoelectric ceramic material as the major component with a thickness of 200 $\mu$m so as to form internal electrodes. Second, 200 green sheets are stacked one on another with the side on which the internal electrodes are printed facing upward. A set of five green sheets without the electrode paste printed thereon is then stacked on each side of the stack, on top and bottom, and the resultant stack is pressed to make a laminate. Next, the laminate is processed to remove binder contained in the green sheets and in the internal electrodes, and is sintered to make a sintered laminate. Further, an insulator, external electrodes and lead wires are connected to the sintered laminate, thereby to complete the actuator.

The actuator that is made as described above has an advantage that it is easy to make the multi-layer laminate of the piezoelectric ceramic material and the electrode material and that the actuator can be manufactured at a low cost, and therefore has been preferably used as the actuator for the printing head of ink jet printers, the positioning actuator for the X-Y stage and the like.

Unfortunately, the conventional actuator is relatively large in thickness which imposes a limitation to the amount of displacement, resulting in a problem that large displacement cannot be achieved. Moreover, there is also a problem of deteriorating characteristics of the actuator displacement, thus resulting in a marked decrease in the displacement of the printing head.

In high resolution printers which have been showing remarkable progress recently, in particular, thinner piezoelectric ceramic layers are employed in order to achieve greater displacement of the actuator. In the case of a thin actuator made by stacking piezoelectric ceramic layers each measuring several tens of micrometers or less in thickness or an actuator having a total thickness of 100 $\mu$m or less, on the other hand, there is such a problem that shrinkage of the internal electrodes caused during sintering results in significant deformation because the actuator is very thin.

There is also such a problem that the d constant varies significantly across a single element, since residual stress is distributed unevenly across the actuator by uneven shrinkage of the internal electrodes. In such a thin actuator as described above, in particular, in case a plurality of displacement elements are mounted on a single circuit board, significant variations beyond ±10% occur in the amount of displacement among the actuators. It requires an expensive IC to control the operation of the actuators having such significant variations, thus resulting in an increase in the manufacturing cost of the printing head or the printer, while requiring complicated control scheme.

SUMMARY OF THE INVENTION

Accordingly, an advantage of the present invention is to provide a laminated piezoelectric element and an actuator that are capable of making larger displacement with less variation in the displacement.

Another advantage of the present invention is to provide a printing head that has a better displacement characteristic and is capable of printing with higher picture quality and higher resolution.

The present inventors have found that, in the case of a laminated piezoelectric element having a thickness larger than 100 $\mu$m, shrinkage of the electrode occurs in the direction of the thickness thus resulting in less residual stress within the surface since the piezoelectric ceramic layer has a greater thickness compared to that of the electrode, while in the case of a laminated piezoelectric element having a thickness within 100 $\mu$m, shrinkage of the electrode has an influence over the entire laminated piezoelectric element and causes a difference in shrinkage between the electrode and the piezoelectric ceramic layer, thus resulting in a significant residual stress remaining after sintering.

Based on this finding, the present inventors have further studied and reached another finding that it is made possible to decrease the residual stress in the laminated piezoelectric element and prevent it from deforming by improving the wettability of the paste to form the electrode and the piezoelectric ceramic layer thereby increasing the bonding between these members, so that uniform distribution of the d constant (piezoelectric strain constant) across the actuator surface can be obtained.

Specifically, the laminated piezoelectric element having a thickness of 100 $\mu$m or less of the present invention includes a laminate having a plurality of piezoelectric ceramic layers, and electrodes provided at least one of the surface and the inside of the laminate, wherein the electrodes includes a silver-palladium alloy containing 71 to 99.9% by volume of silver and 0.1 to 29% by volume of palladium. This laminated piezoelectric element can make a large displacement because of a small thickness, while variations in displacement are small because of reduced residual stress. As a result, the laminated piezoelectric element and the actuator thus obtained allow easy control of displacement and provide a stable piezoelectric characteristic.

The electrodes of the laminated piezoelectric element according to the present invention preferably includes a silver-palladium alloy that contains 87% by volume or more silver and has a residual stress of 100 MPa or less remaining inside. When the silver-palladium alloy containing 87% by volume or more silver is used and the firing conditions are controlled, higher effect of reducing the residual stress can be obtained and a laminated piezoelectric element having better displacement characteristics can be made, so that a high performance printing head can be made when used as an actuator.

The piezoelectric ceramic layer preferably contains Pb, which enables it to improve the wettability between the piezoelectric ceramic layer and the silver-palladium alloy that makes the electrodes.

It is also preferable that the electrodes include piezoelectric ceramic material, and the proportion of the silver-palladium alloy to the piezoelectric ceramic material is in a range from 100:16 to 60. This constitution further improves the bonding strength between the electrode and the piezoelectric ceramic layer so as to effectively restrict the deformation of the piezoelectric ceramic element and maintain a low electrical conductivity.

It is also preferable that the piezoelectric ceramic material has a mean crystal grain size of 0.9 $\mu$m or less, which makes the microscopic structure of the electrodes homogeneous and makes it easier to reduce the residual stress.

Each piezoelectric ceramic layer in the laminated piezoelectric element according to the present invention is preferably in a range from 1 to 25 $\mu$m in thickness, which makes it possible to increase the displacement of the actuator.

When a voltage is applied between the electrodes, variations in the d constant are preferably within ±10% across the surface, which enables it to use a low-cost IC for controlling the displacement when a plurality of displacement elements are mounted on a single circuit board.

In addition, the bonding strength between the electrodes and the piezoelectric ceramic layer is preferably 1.25 MPa or higher, which makes it easier to maintain stable piezoelectric characteristics.

The actuator of the present invention is characterized in that it is constituted from the laminated piezoelectric element described above, which makes it possible to make an actuator that has high reliability and better piezoelectric characteristics.

It is particularly preferable to join a support member to the bottom surface of the laminated piezoelectric element. This constitution makes it possible to reduce and stabilize variations in displacement.

Specifically, the actuator of the present invention includes an oscillator plate, internal electrodes provided on the oscillator plate, a piezoelectric ceramic layer provided on the internal electrodes and a plurality of surface electrodes provided on the piezoelectric ceramic layer.

The printing head of the present invention includes a flow passage member in which a plurality of ink compressing chambers having ink nozzles are arranged and an actuator mounted on the flow passage member. The ink compressing chambers and the surface electrodes are aligned with each other. Such a printing head has a better displacement characteristic and is capable of printing with higher picture quality and higher resolution.

Various advantages of the present invention will become apparent in the course of the description, which follows.

DESCRIPTION OF PREFERRED EMBODIMENTS

Figure 1:
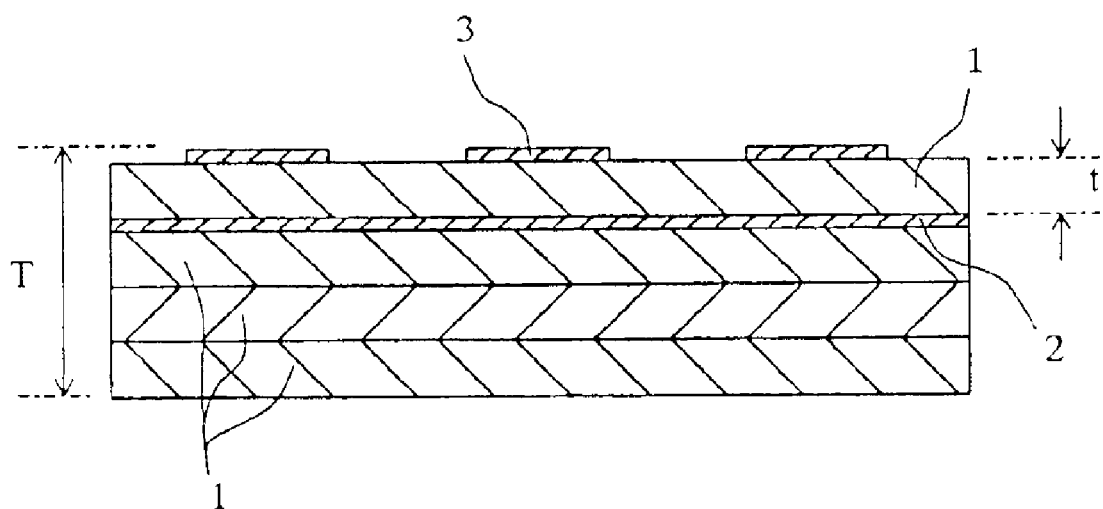
FIG. 1 is a schematic sectional view showing a laminated piezoelectric element of the present invention.

Now the laminated piezoelectric element and an actuator of the present invention will be described in detail below with reference to the accompanying drawings. FIG. 1 is a sectional view showing the laminated piezoelectric element according to one embodiments of the present invention.

As shown in FIG. 1 the laminated piezoelectric element has a laminate of a plurality of piezoelectric ceramic layers 1 and electrodes provided on the surface and inside of the laminate. The electrodes includes internal electrode 2 stacked inside of the laminate and a plurality of surface electrodes 3 disposed on the surface of the laminate. Thus a plurality of displacement elements consisting of the surface electrodes 3, the internal electrodes 2 and the piezoelectric ceramic layers 1 that are interposed between the electrodes are formed. The laminated piezoelectric element can be used preferably as an actuator by connecting lead wires to the surface electrodes 3 for the electrical connection with the outside.

It is important that a total thickness T of the laminated piezoelectric element is 100 $\mu$m or less, preferably 85 $\mu$m or less and more preferably 70 $\mu$m or less. This allows it to have a larger displacement of each displacement element and achieve high efficiency in driving the displacement elements with a low voltage.

The thickness t of the piezoelectric ceramic layer is from 1 to 25 $\mu$m, preferably 3 to 22 $\mu$m, more preferably from 5 to 19 $\mu$m, and most preferably from 7 to 16 $\mu$m, in order to increase the displacement while effectively preventing cracks and breakage from occurring and maintaining the shape.

The thin laminated piezoelectric element having a total thickness of 100 $\mu$m or less of the prior art has been suffering significant deformation resulting from firing, since the piezoelectric ceramic layer is too thin. Particularly in a laminated piezoelectric element wherein the thickness of each piezoelectric ceramic layer is 25 $\mu$m or less, it has been very difficult to suppress the displacement. Moreover, the residual stress that is distributed unevenly has a marked effect on the d constant, thus resulting in unpredictable variations across a single circuit board. It has been especially difficult to control the displacement of the actuator, in the case of a laminated piezoelectric element having a plurality of displacement elements mounted on a single circuit board.

According the present invention, in contrast, piezoelectric characteristic can be stabilized by improving the wettability of the silver-palladium (Ag—Pd) electrodes and the piezoelectric ceramic layer, thereby increasing the bonding strength between these members. When an actuator consisting of the laminated piezoelectric element of the present invention shown in FIG. 1 is driven with an alternate signal having frequency of 20 KHz, for example, stable displacement is achieved and the problem of the prior art that oscillation stops in three hours can be solved.

According to the present invention, it is important to use a silver-palladium alloy containing 71 to 99.9% by volume of silver and 0.1 to 29% by volume of palladium as the electrodes, in order to increase the bonding strength between the electrodes and the piezoelectric ceramic layer. The electrode having such a composition has better wettability with the piezoelectric ceramic material and is expected to improve the bonding strength between these members.

In order to further decrease the residual stress between the piezoelectric ceramic layer 1 and the electrodes 2, 3, the lower limit of the silver content in the electrodes 2, 3 is preferably 80% by volume, more preferably 85% by volume, and most preferably 90% by volume. The upper limit of the silver content is 99.9% by volume, preferably 97% by volume, and more preferably 95% by volume.

Also according to the present invention, the electrodes made by simultaneous firing preferably include a silver-palladium alloy containing 87% or more by volume, preferably 90% or more by volume and most preferably 93% or more by volume of silver, while controlling the residual stress remaining in the actuator after firing within 100 MPa, preferably within 85 MPa and most preferably 70 MPa. By controlling the silver content in the electrode to not less than 87% by volume, such a remarkable effect can be expected as the compressive stress due to shrinkage of the electrode is reduced. Also by controlling the residual stress in the actuator within 100 MPa, it is made possible to suppress the decrease in capacitance of the piezoelectric ceramic layer and prevent the displacement of the displacement element from decreasing.

In order to further increase the bonding strength and reduce the residual stress thereby improving the stability of the piezoelectric characteristic further, it is preferable that at least a part of the electrodes, particularly the internal electrode 2, contains the piezoelectric ceramic material. In order to increase the bonding strength between the piezoelectric ceramic layer 1 and the electrodes while reducing the residual stress, a proportion of the piezoelectric ceramic material is preferably from 16 to 60% by volume of the silver-palladium alloy, more preferably from 18 to 50% by volume and most preferably from 20 to 30% by volume.

In order to achieve uniform distribution of the residual stress, it is preferable that the piezoelectric ceramic material has a mean crystal grain size of 0.9 $\mu$m or less, more preferably 0.7 $\mu$m or less and most preferably 0.6 $\mu$m or less. When the crystal grain size is controlled in the range described above, residual stress, if it ever existed, is distributed uniformly among the plurality of displacement elements, thereby minimizing the influence on the displacement characteristic through the reduction in the variation of the residual stress.

In the laminated piezoelectric element of the present invention, when a voltage is applied between the internal electrode 2 and the surface electrode 3, the piezoelectric ceramic layer 1 interposed between the electrodes displaces. In case a plurality of displacement elements are formed on a single circuit board, it is made possible to use a low-cost IC for controlling the displacement element by suppressing the variations in the d constant preferably within ±10% across the surface, thereby reducing the cost of the unit including the actuator. In the laminated piezoelectric element of the present invention, since residual stress is reduced by increasing the bonding strength of the electrodes and the piezoelectric ceramic layer, the variations in the d constant can be controlled within ±10% across the surface.

In addition, by setting the bonding strength between the internal electrode 2 and the piezoelectric ceramic layer 1 to 1.25 MPa or higher, preferably to 2 MPa or higher and more preferably to 5 MPa or higher, a stable piezoelectric characteristic can be obtained and it is made possible to suppress exfoliation of the piezoelectric ceramic layer 1 and the electrodes 2, 3 that would lead to failure of driving, when driving the actuator.

By combining the silver-palladium alloy and the piezoelectric ceramic layer 1, it is made possible to suppress the deformation of the laminated piezoelectric element and the variations of the d constant across the surface, thereby to obtain the laminated piezoelectric element that allows easy control of the displacement. The laminated piezoelectric element of the present invention can be applied particularly preferably to a device having a plurality of displacement elements mounted on a single circuit board. This constitution has an advantage of making it easier to control the displacement and allow the use of a low-cost IC.

In the present invention, the term piezoelectric ceramic material refers to a ceramic material that shows piezoelectricity, such as Bi layer compound, material having tungsten-bronze structure, alkali niobate compound of perovskite structure, lead zirconate titanate (PZT) containing Pb and a compound of perovskite structure containing lead titanate. Among these materials, lead zirconate titanate containing Pb and lead titanate are particularly preferable for improving the wettability and hence the bonding strength with the electrodes.

Specifically, a crystal containing Pb as a constituent element at site A and Zr and/or Ti as constituent element at site B, and especially made of a lead zirconate titanate-based compound is preferable for obtaining a stable sintered piezoelectric material that has a higher d constant.

It is also preferable that the piezoelectric ceramic layer 1 contains at least one kind selected from among Sr, Ba, Ni, Sb, Nb, Zn and Te, which enables it to obtain the laminated piezoelectric element having higher stability. Specifically, one made by solid solution of auxiliary components Pb(Zn1/3Sb2/3)O3 and Pb(Ni1/2Te1/2)O3 may be used.

It is particularly desirable to further include an alkali earth element as the constituent element at site A. As the alkali earth element, Ba and Sr are particularly preferable since they enable the piezoelectric layer to achieve greater displacement. It is advantageous to include 0.02 to 0.08 moles of Ba and 0.02 to 0.12 moles of Sr for achieving a large displacement in case the composition is dominated by a tetragonal crystal system.

Specifically, for example, a material having the composition of $Pb_{1-x-y}Sr_xBa_y(Zn_{1/3}Sb_{2/3})_a(Ni_{1/2}Te_{1/2})_bZr_{1-a-b-c}Ti_cO_3+\alpha$ wt % $Pb_{1/2}NbO_3$ ($0 \geq x \geq 0.14$, $0 \geq y \geq 0.14$, $0.05 \geq a \geq 0.1$, $0.002 \geq b \geq 0.01$, $0.44 \geq c \geq 0.50$, $\alpha = 0.1 \sim 1.0$) may be used.

Now the method of manufacturing the laminated piezoelectric element of the present invention will be described below in the case of using PZT as the piezoelectric ceramic material, by way of example.

First, PZT powder having a purity of 99% and a mean particle size of 1 $\mu$m or less is prepared as the material to make the piezoelectric ceramic material.

A mixture of the piezoelectric ceramic powder and an organic binder is formed into the shape of tape, to make a plurality of green sheets. Some of the green sheets are coated with an Ag—Pd paste that makes the internal electrode on part thereof, with the green sheets being stacked one on another and cut into a desired shape. These laminates are heated to around 400° C. to remove the binder, and then fired at a temperature from 900 to 1050° C. Then the surface electrode is formed on the surface, and the piezoelectric ceramic layer between the internal electrodes and the surface electrode is subjected to polarization, thereby to complete the laminated piezoelectric element.

When fabricating the laminate of the green sheets, it is preferable to attach a constraint sheet, that includes the piezoelectric ceramic material of substantially the same composition as that of the green sheet and an organic composition, on one or both of the laminate and pressed together. Restricting the outside green sheet from shrinking by means of the constraint sheet has an effect of suppressing the warp of the laminate, thus enabling it to reduce the stress generated therein when bonding it with a supporting substrate.

Density of the green sheet before sintering is preferably 4.5 g/cm² or higher. By increasing the density of the sintered material to 4.5 g/cm² or higher, it is made possible to sinter at a lower temperature. When the density of the green sheet is increased further, Pb can be restricted from evaporating.

The actuator of the present invention is provided with the laminated piezoelectric element described above, and is featured by the capability to make a large displacement. It is particularly preferable that the laminated piezoelectric element described above is bonded onto the supporting substrate.

The actuator of the present invention has a plurality of displacement elements mounted on a single circuit board, and can be preferably applied to an ink jet printing head used in an apparatus that utilizes the ink jet technology.

Figure 2:
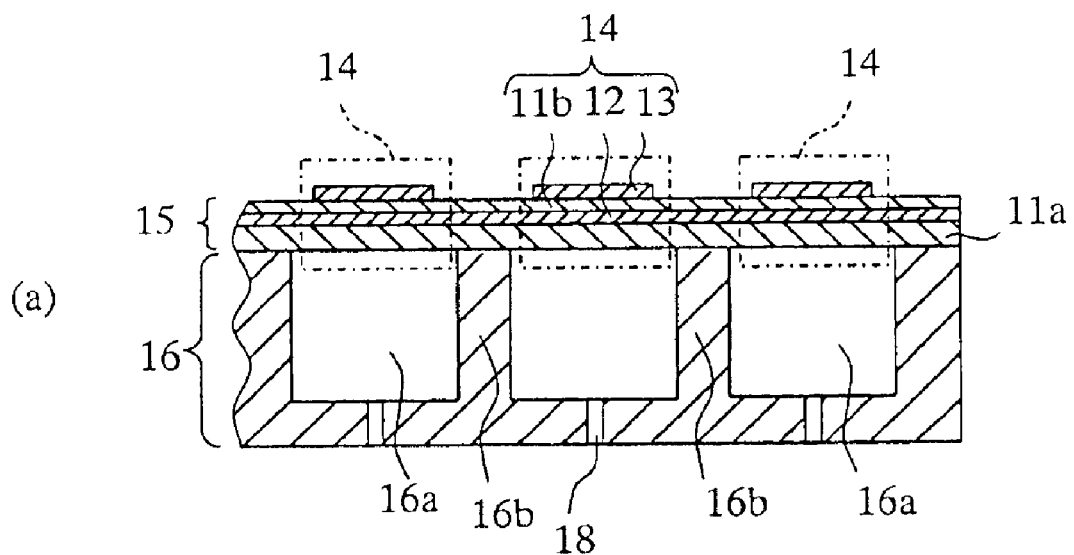
FIG. 2(a) is a schematic sectional view showing a printing head provided with an actuator including the laminated piezoelectric element of the present invention.
FIG. 2(b) is a plan view thereof.
Figure 2:
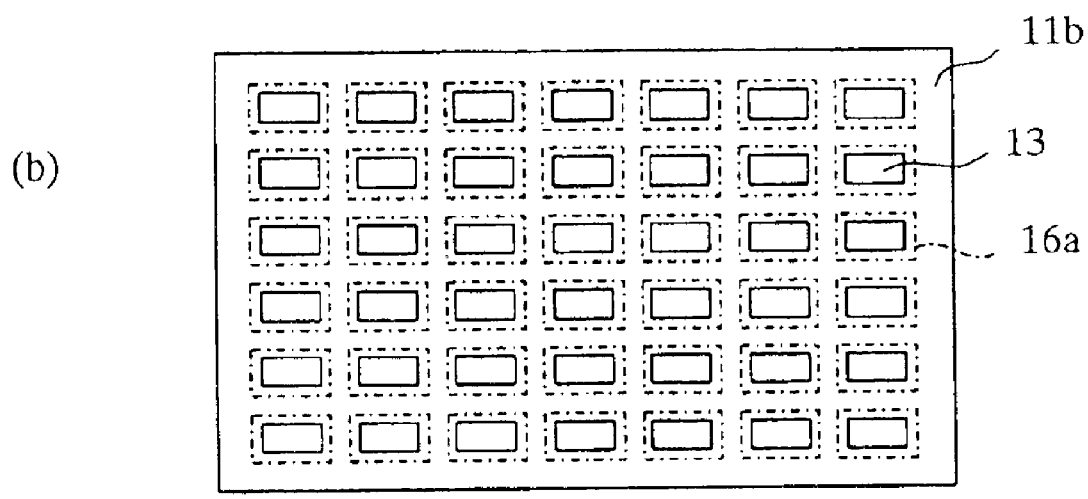

In the ink jet printing head shown in FIGS. 2(a), (b), for example, an actuator 15 is bonded to a flow passage member 16 that has a plurality of ink compressing chambers 16a having ink nozzles 18 and a partition walls 16b that separate the ink compressing chambers 16a. Thus this printing head has such a constitution as the actuator 15 is placed on the flow passage member 16 wherein the plurality of ink compressing chambers 16a having the ink nozzles 18 are arranged, with the ink compressing chambers 16a and the surface electrode 13 being aligned with each other.

The actuator 15 is made by forming the internal electrode 12 on one of the principal surfaces of the piezoelectric ceramic layer 11b, forming the surface electrode 13 on the other principal surface, and forming the displacement elements 14, that include the surface electrode 13, the internal electrode 12 and piezoelectric ceramic layer 11a interposed between these electrodes, on an oscillator plate 11.

Specifically, the actuator 15 including the internal electrode 12, the piezoelectric ceramic layer 11b having a thickness of 50 μm or less and the surface electrode 13 that are stacked in this order on the oscillator plate 11a, and a plurality of the surface electrodes 13 that are disposed on the surface of the piezoelectric ceramic layer 11b, is bonded onto the flow passage member 16 so that the surface electrodes 13 are located right above the ink compressing chambers 11. The above piezoelectric ceramic material can be used as the oscillator plate 11a.

With this printing head, when a voltage is applied by a drive circuit between one of the surface electrodes 13 and the internal electrode 12, the piezoelectric ceramic layer 11b located right below the particular surface electrode 13 is displaced so as to apply a pressure to the ink in the ink compressing chamber 13a, so that a drop of ink is discharged from an ink outlet orifice 18 that opens at the bottom of the flow passage member 16.

By using the laminated piezoelectric element of the present invention as the actuator of the printing head, the printing head can be made by using a low-cost IC.

The printing head according to the present invention has better displacement characteristic that enables it to discharge the ink at a higher speed with higher precision, and is preferably used for high speed printing. A printer that includes the printing head according to the present invention, an ink tank which supplies ink to the printing head and a paper transfer mechanism is capable of printing at a higher speed with higher precision more easily than the prior art.

The following examples illustrate the manner in which the present invention can be practiced. It is understood, however, that the examples are for the purpose of illustration and the invention is not to be regarded as limited to any of the specific materials or condition therein.

EXAMPLE 1

The laminated piezoelectric element of the present invention was fabricated and was applied to an ink jet printing head as an actuator.

First, a powder of piezoelectric ceramic material containing lead zirconate titanate (PZT) having a purity of 99% or higher was prepared as the starting material.

The piezoelectric ceramic powder was mixed with butyl methacrylate used as an aqueous binder, ammonium polycarbonate used as a dispersant and isopropyl alcohol and water used as solvents, to obtain a slurry. The slurry was spread over a carrier film by means of a doctor blade, so as to form a green sheet having a thickness of 30 μm.

Then a paste to form the internal electrode was made by mixing a Ag—Pd alloy containing silver and palladium in proportions shown in Table 1 and the piezoelectric ceramic powder containing PZT as the main component, thereby to obtain the composition of the internal electrode shown in Table 1. The Ag—Pd alloy and the piezoelectric ceramic powder were added to separate vehicles that contained an organic binder and an organic solvent, and were well mixed to obtain the paste to make the internal electrode.

The paste was applied to the surface of the green sheet to a thickness of 4 μm by printing, thereby forming the internal electrode. Then, two green sheets without any internal electrode, the green sheet with the internal electrode on the surface, and the green sheet without any internal electrode were stacked in this order, and pressed to make a laminate.

The laminate, after being degreased, was sintered by keeping at the sintering temperature shown in Table 1 for two hours in an atmosphere having an oxygen concentration of 99% or higher, thereby making a sintered laminate consisting of the piezoelectric ceramic layer 1 and the internal electrodes 2. Then the surface electrode 3 was formed on one surface of the sintered laminate by applying Au paste by the screen printing process and firing at a temperature from 600 to 800° C. in air atmosphere. 600 points of the surface electrode 3 were formed on one substrate.

Last, lead wires were connected to the surface electrodes 3 by soldering, thus completing the laminated piezoelectric element having the configuration shown in FIG. 1.

Samples used in measuring the d constant and bonding strength were fabricated as described below. The laminated piezoelectric element made as described above was formed into a 10 cm square, that was polished only on one side thereof, leaving only one layer of the piezoelectric ceramic material. Electrodes were formed by vapor deposition of Au on both surfaces of this ceramic sheet. The ceramic sheet was then cut into strips measuring 12 mm by 3 mm by dicing, and the strips were subjected to polarization by applying a DC voltage of 3 kv/mm in silicone oil. Resonance frequency, antiresonance frequency, resonance resistance, antiresonance resistance and capacitance of the elements thus obtained were measured using an impedance analyzer (Agilent Technologies' model 4194A), and the value of d31 was determined using a value of the density determined by Archimedes' method. The values of d31 were averaged and a maximum percent deviation from the mean value was taken as the variation of d31.

Figure 3:
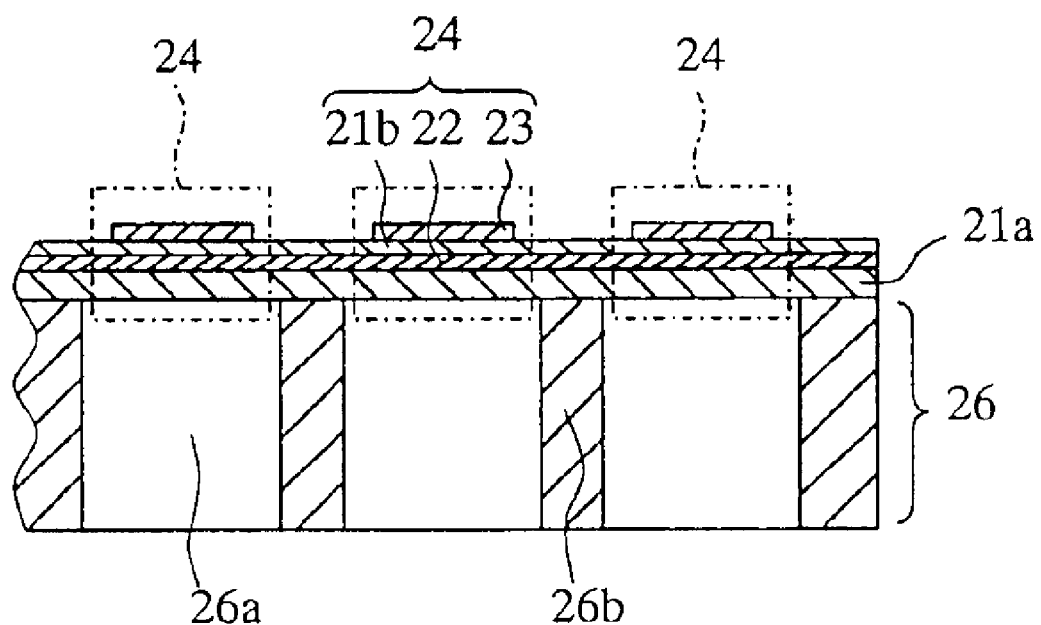
FIG. 3 is a schematic sectional view showing a structure for evaluating the laminated piezoelectric element of the present invention.

Displacement was measured using the setup shown in FIG. 3, wherein the actuator that included a plurality of displacement elements 24, that were made by interposing the piezoelectric ceramic layer 21b between the surface electrode 23 and the internal electrodes 22, disposed on an oscillator plate 21a, with the actuator being bonded onto a supporting member 26 having grooves 26a and partition walls 26b.

The actuator was irradiated with a laser beam on the side where the groove 26a are formed by means of a laser Doppler displacement meter, so as to measure displacements at the center and seven points along the periphery of the groove 26a, and the displacements were averaged.

The electrode resistance was measured between two VIA electrodes connected to the internal electrodes using the impedance analyzer (Agilent Technologies' model 4194A) at 25° C.

For the bonding strength, a tensile test was conducted on the laminate from which the binder has not been removed, having a partial electrode measuring 2 mm by 2 mm made of the same material as that of the internal electrode printed thereon, that was fired under the same conditions as described above. Then, a Cu wire 0.8 mm in diameter was connected to the partial electrode measuring 2 mm by 2 mm by soldering. The test result is shown in Table 1.

TABLE 1

| | Internal electrode composition | | | | Thickness | | | | | | |
| | Ag—Pd alloy | | Ceramic powder | | Each com- | | | | | | |
| Sample No. | Ag % by volume | Pd % by volume | Content % by volume | grain size $\mu$m | ponent layer $\mu$m | Total $\mu$m | Firing temp. ° C. | Variations of d31 % | Displacement nm | Electrode resistance $\Omega$ | Bonding strength MPa/mm$^2$ |
|---|---|---|---|---|---|---|---|---|---|---|---|
| 1 | 99.9 | 0.1 | 25 | 0.5 | 25 | 100 | 900 | 2 | 85 | 2 | 14.2 |
| 2 | 97 | 3 | 25 | 0.5 | 25 | 100 | 950 | 2 | 86 | 2 | 15.1 |
| 3 | 95 | 5 | 25 | 0.5 | 25 | 100 | 960 | 2 | 85 | 2 | 14.1 |
| 4 | 90 | 10 | 25 | 0.5 | 25 | 100 | 1000 | 2 | 85 | 2 | 15.2 |
| 5 | 85 | 15 | 25 | 0.5 | 25 | 100 | 1000 | 2 | 85 | 2 | 13.1 |
| 6 | 80 | 20 | 25 | 0.5 | 25 | 100 | 1000 | 3 | 86 | 2 | 10.1 |
| 7 | 75 | 25 | 25 | 0.5 | 25 | 100 | 1000 | 5 | 85 | 2 | 5.2 |
| * 8 | 70 | 30 | 25 | 0.5 | 25 | 100 | 1000 | 11 | 86 | 2 | 1.1 |
| * 9 | 65 | 35 | 25 | 0.5 | 25 | 100 | 1000 | 15 | 85 | 2 | 0.4 |
| 10 | 80 | 20 | 10 | 0.5 | 25 | 100 | 1000 | 10 | 85 | 2 | 5.1 |
| 11 | 80 | 20 | 16 | 0.5 | 25 | 100 | 1000 | 3 | 86 | 2 | 6.2 |
| 12 | 80 | 20 | 20 | 0.5 | 25 | 100 | 1000 | 2 | 85 | 2 | 7.1 |
| 13 | 80 | 20 | 30 | 0.5 | 25 | 100 | 1000 | 2 | 85 | 2 | 14.1 |
| 14 | 80 | 20 | 40 | 0.5 | 25 | 100 | 1000 | 2 | 85 | 2 | 14.1 |
| 15 | 80 | 20 | 50 | 0.5 | 25 | 100 | 1000 | 2 | 86 | 2 | 15.2 |
| 16 | 80 | 20 | 60 | 0.5 | 25 | 100 | 1000 | 2 | 85 | 2 | 15.1 |
| 17 | 80 | 20 | 70 | 0.5 | 25 | 100 | 1000 | 2 | 86 | 30 | 15.2 |
| 18 | 80 | 20 | 80 | 0.5 | 25 | 100 | 1000 | 2 | 86 | 1000 | 14.1 |
| 19 | 80 | 20 | 25 | 0.6 | 25 | 100 | 1000 | 3 | 86 | 2 | 10.1 |
| 20 | 80 | 20 | 25 | 0.8 | 25 | 100 | 1000 | 3 | 86 | 2 | 10.3 |
| 21 | 80 | 20 | 25 | 0.9 | 25 | 100 | 1000 | 3 | 86 | 2 | 10.2 |
| 22 | 80 | 20 | 25 | 1.0 | 25 | 100 | 1000 | 10 | 85 | 2 | 10.3 |
| 23 | 80 | 20 | 25 | 0.5 | 12 | 48 | 1000 | 2 | 85 | 2 | 10.1 |
| 24 | 80 | 20 | 25 | 0.5 | 15 | 60 | 1000 | 2 | 86 | 2 | 10.2 |
| 25 | 80 | 20 | 25 | 0.5 | 18 | 72 | 1000 | 2 | 85 | 2 | 10.1 |
| 26 | 80 | 20 | 25 | 0.5 | 20 | 80 | 1000 | 2 | 86 | 2 | 10.1 |
| 27 | 80 | 20 | 25 | 0.5 | 25 | 100 | 1000 | 2 | 85 | 2 | 10.2 |
| * 28 | 80 | 20 | 25 | 0.5 | 30 | 1000 | 1000 | 2 | 20 | 2 | 10.1 |

Sample numbers marked with * are not within the scope of the present invention.
(the variations of d31) = {M/(the mean value of d31)} × 100
[M is maximum difference between the value of d31 and the mean value of d31.]

Samples Nos. 1 to 7 and Nos. 10 to 27 of the present invention were laminated piezoelectric elements showing variations of d31 within 10% and a bonding strength of 5 MPa/mm 2 or higher, allowing it to easily control the displacement.

Samples Nos. 8 and 9, out of the scope of the present invention, that contained 70% by volume or less silver showed significant variation in d31 of 11% or more and low bonding strength of 1.26 MPa/mm$^2$ or less.

Sample No. 28, out of the scope of the present invention, having a total thickness of 1000 $\mu$m (1 mm) showed very low displacement characteristic with a low displacement of 20 nm.

EXAMPLE 2

High purity powders of $Pb_2O_3$, $ZrO_2$, $TiO_2$, $BaCO_3$, ZnO, $SrCO_3$, $Sb_2O_3$, NiO, $TeO_2$ were prepared as the stock materials. Predetermined quantities of these powders were measured to obtain the compositions A1 to D1 described below after sintering.

[A1]: $Pb_{1-x-y}Sr_xBa_y(Zr_{1/3}Sb_{2/3})_a(Ni_{1/2}Te_{1/2})_bZr_{1-a-b-c}Ti_cO_3$ (x=0.04, y=0.02, a=0.075 b=0.005, c=0.45)
[B1]: $Pb(Zn_{1/3}Sb_{2/3})_{0.075}(Ni_{1/3}Te_{1/2})_{0.005}Zr_{0.47}Ti_{0.04}O_3$
[C1]: $PbZr_{0.5}Ti_{0.5}O_3$
[D1]: $BaTiO_3$

The predetermined quantities of the powders measured as described above were mixed in a wet process in a ball mill for 20 hours, and the mixture was dewatered and dried. The dried mixture was calcined at 900° C. for three hours, and the calcined material was crushed in a wet process in a ball mill.

The crushed material was mixed with an organic binder, water, a dispersant and a plasticizer to make a slurry. The slurry was formed into a sheet by the roll coater process that is commonly employed when forming a thin green sheet, thereby making a green sheet. The thickness of the green sheet was set by taking the shrinkage ratio into consideration so that the thickness shown in Table 2 could be achieved after firing.

The green sheet was punched through using a die to make a plurality of rectangular sheets. The paste containing the Ag—Pd alloy was applied to the surface of the rectangular sheets by screen printing, thereby forming the internal electrodes and the surface electrodes.

The green sheets coated with the electrode paste and the green sheets without the electrode paste were stacked one on another as shown in FIG. 1, and were pressed while heating so as to fuse together, thereby making the laminate.

After degreasing the laminate at 400° C., the laminate was fired under the conditions shown in Table 1 for two hours, thereby making the actuator.

After polishing the cross section of the ceramic layers, the thickness of the actuator was measured by means of a microscope. Bonding of the piezoelectric ceramic layer and the electrodes was visually checked to see if there was exfoliation.

Residual stress in the actuator was measured by means of an X-ray diffraction with a characteristic X-ray of Fe and a diffraction peak of 126°, using a collimator having a diameter of 2 mm. Residual stress is given with a negative sign if it is a compressive stress.

Displacement was measured similarly to Example 1, with the results shown in Table 2.

TABLE 2

| Sample No. | Piezo-electric ceramic layer kind | Internal electrode composition Ag % by volume | Pd % by volume | Condition of firing temp. ° C. | Oxygen concentration % | Thickness Each component layer μm | Total μm | Actuator Residual stress MPa | Displacement nm | Exfoliation of the electrodes |
|---|---|---|---|---|---|---|---|---|---|---|
| 29 | A1 | 70 | 30 | 1000 | 98 | 11 | 60 | −150 | 22 | no |
| 30 | A1 | 80 | 20 | 1000 | 98 | 11 | 60 | −110 | 48 | no |
| 31 | A1 | 87 | 13 | 1000 | 98 | 11 | 60 | −90 | 60 | no |
| 32 | A1 | 90 | 10 | 1000 | 98 | 11 | 60 | −70 | 72 | no |
| 33 | A1 | 93 | 7 | 980 | 98 | 11 | 60 | −55 | 80 | no |
| 34 | A1 | 95 | 5 | 960 | 98 | 11 | 60 | −50 | 82 | no |
| 35 | A1 | 97 | 3 | 950 | 98 | 11 | 60 | −30 | 77 | no |
| 36 | A1 | 99 | 1 | 930 | 98 | 11 | 60 | −20 | 70 | no |
| 37 | A1 | 90 | 10 | 1000 | 98 | 60 | 50 | −100 | 40 | no |
| 38 | A1 | 90 | 10 | 1000 | 98 | 50 | 50 | −90 | 50 | no |
| 39 | A1 | 90 | 10 | 1000 | 98 | 20 | 50 | −80 | 60 | no |
| 40 | A1 | 90 | 10 | 1000 | 98 | 15 | 50 | −75 | 70 | no |
| 41 | A1 | 90 | 10 | 1000 | 98 | 5 | 50 | −67 | 75 | no |
| 42 | A1 | 90 | 10 | 1000 | 98 | 3 | 50 | −70 | 80 | no |
| 43 | A1 | 90 | 10 | 950 | 98 | 11 | 45 | −78 | 68 | no |
| 44 | A1 | 90 | 10 | 900 | 98 | 11 | 45 | −80 | 65 | no |
| 45 | A1 | 90 | 10 | 1000 | 95 | 11 | 50 | −80 | 68 | no |
| 46 | B1 | 90 | 10 | 1000 | 98 | 11 | 50 | −80 | 55 | no |
| 47 | C1 | 90 | 10 | 1000 | 98 | 11 | 50 | −75 | 50 | no |
| 48 | D1 | 90 | 10 | 1000 | 98 | 11 | 50 | −80 | 30 | no |
| * 49 | A1 | 90 | 10 | 1000 | 98 | 20 | 200 | −85 | 15 | no |

Sample numbers marked with * are not within the scope of the present invention.
A1 $Pb_{0.94}Sr_{0.04}Ba_{0.02}(Zn_{1/3}Sb_{2/3})_{0.075}(Ni_{1/2}Te_{1/2})_{0.005}Zr_{0.47}Ti_{0.45}O_3$
B1 $Pb(Zn_{1/3}Sb_{2/3})_{0.075}(Ni_{1/2}Te_{1/2})_{0.005}Zr_{0.47}Ti_{0.45}O_3$
C1 $PbZr_{0.5}Ti_{0.5}O_3$
D1 $BaTiO_3$ Table 2 shows that samples Nos. 29 to 45 of the present invention having composition A1 showed displacements of 20 nm or larger. Samples Nos. 31 to 45 having Ag content of 87% by volume or higher and residual stress of 100 MPa or less showed displacements of 40 nm or larger. Samples Nos. 32 to 36 and Nos. 39 to 45 having residual stress of 85 MPa or less, in particular, showed displacements of 60 nm or larger. Samples Nos. 32 to 36 and Nos. 40 to 42 having residual stress of 75 MPa or less showed displacements of 70 nm or larger.

Samples Nos. 46 to 48 of the present invention having compositions B1, C1 and D1 showed displacements of 30 nm or larger.

Samples No. 49 having composition A1 but 200 μm thick, in contrast, showed a small displacement of 15 nm.

What is claimed is:
1. A laminated piezoelectric element comprising:
    a laminate having a plurality of piezoelectric ceramic layers; and
    electrodes provided at least on a surface and inside the laminate, wherein the electrodes include a silver- palladium alloy containing 71 to 99.9% by volume of silver and 0.1 to 29% by volume of palladium and the laminated piezoelectric element has a thickness of 100 μm or less.

2. The laminated piezoelectric element according to claim 1, wherein the electrodes include a silver-palladium alloy containing 87% by volume or more silver, and a residual stress remaining inside is 100 MPa or less.

3. The laminated piezoelectric element according to claim 1, wherein the piezoelectric ceramic layers contain Pb.

4. The laminated piezoelectric element according to claim 1, wherein the electrodes contain a piezoelectric ceramic material, and proportions of the silver-palladium alloy to the piezoelectric ceramic material are in a range from 100:16 to 60.

5. The laminated piezoelectric element according to claim 4, wherein the piezoelectric ceramic material has a mean crystal grain size of 0.9 μm or less.

6. The laminated piezoelectric element according to claim 1, wherein each piezoelectric ceramic layer is in a range from 1 to 25 μm in thickness.

7. The laminated piezoelectric element according to claim 1, wherein variations in a d constant is within ±10% across the surface when a voltage is applied between the electrodes.

8. The laminated piezoelectric element according to claim 1, wherein a bonding strength between the electrodes and the piezoelectric ceramic layer is 1.25 MPa or higher.

9. An actuator comprising the laminated piezoelectric element of claim 1.

10. The actuator according to claim 9, wherein a supporting member is bonded onto a bottom surface of the laminated piezoelectric element.

11. An actuator, comprising:
an oscillator plate;
internal electrodes provided on the oscillator plate;
a piezoelectric ceramic layer provided on the internal electrodes; and
a plurality of surface electrodes provided on the piezoelectric ceramic layer,
wherein the oscillator plate, the internal electrodes, the piezoelectric ceramic layer and the surface electrodes include the laminated piezoelectric element of claim 1.

12. A printing head comprising a flow passage member in which a plurality of ink compressing chambers having ink nozzles are arranged and the actuator of claim 11 mounted on the flow passage member, wherein the ink compressing chambers and the surface electrodes are aligned with each other.

13. A method of manufacturing a laminated piezoelectric element, comprising:
forming a laminated having a plurality of piezoelectric ceramic layers;
providing electrodes at least on a surface and inside the laminate with the electrodes having a silver-palladium alloy containing 71 to 99% by volume of silver and 0.1 to 29% by volume of palladium; and
forming the laminated piezoelectric element with a thickness of 100 μm or less.

14. The method of manufacturing according to claim 13, further comprising providing the electrodes with a sliver-palladium alloy containing 87% by volume or more silver and obtaining a remaining residual stress inside of 100 MPa or less.

15. The method of manufacturing according to claim 13, further comprising forming the piezoelectric ceramic layers with 9b.

16. The method of manufacturing according to claim 13, further comprising forming the electrodes with a piezoelectric material and the proportions of the silver-palladium alloy to the piezoelectric ceramic material are in a range from 100:16 to 60.

17. The method of manufacturing according to claim 16, further comprising providing the piezoelectric ceramic material with a mean crystal grain size of 0.9 μm or less.

18. The method of manufacturing according to claim 1, further comprising forming each piezoelectric ceramic layer in a range from 1 to 25 μm in thickness.

19. The method of manufacturing according to claim 1, further comprising applying a voltage between electrodes to obtain variations in a d constant within ±10% across the surface.

20. A piezoelectric element, comprising:
a piezoelectric ceramic layer; and
electrodes provided on both sides of the piezoelectric layer,
wherein the electrodes include a silver-palladium alloy containing 71 to 99.9% by volume of silver and 0.1 to 29% by volume of palladium.

* * * * *